United States Patent [19]
Morikawa

[11] Patent Number: 5,313,090
[45] Date of Patent: May 17, 1994

[54] BIPOLAR MEMORY CELL HAVING CAPACITORS

[75] Inventor: Takenori Morikawa, Tokyo, Japan

[73] Assignee: NEC Corporation, Tokyo, Japan

[21] Appl. No.: 724,147

[22] Filed: Jul. 1, 1991

[30] Foreign Application Priority Data

Jun. 29, 1990 [JP] Japan ................... 2-173943

[51] Int. Cl.[5] .............. H01L 29/72; H01L 27/02; H01L 29/06
[52] U.S. Cl. .................. 257/577; 257/554; 257/560; 257/563; 257/571; 257/588
[58] Field of Search ............ 357/45, 14, 34, 35, 357/46, 51; 257/552, 554, 556, 560, 563, 571, 577, 588

[56] References Cited

U.S. PATENT DOCUMENTS 4,956,688 9/1990 Honma et al. ............ 357/34

OTHER PUBLICATIONS

Soft-Error Characteristics in Bipolar Memory Cells With Small Critical Charge, VLSI Symposium circuit, pp. 27-28, 1989, by Y. Idei et al.

Primary Examiner—Ngan Ngo
Attorney, Agent, or Firm—Burns, Doane, Swecker & Mathis

[57] ABSTRACT

A semiconductor device including a semiconductor substrate, first and second bipolar transistors formed at the major surface of the semiconductor substrate, a Schottky-barrier diode formed on a predetermined area of each of the first and second bipolar transistors, a capacitor formed on each of the first and second bipolar transistors, each capacitor including an insulating layer covering a surface of a respective one of the first and second bipolar transistors, a polysilicon layer formed on the insulating layer in a pattern that extends around the predetermined area, a dielectric film formed covering the polysilicon layer, and a conductive film covering the dielectric film.

4 Claims, 11 Drawing Sheets

BIPOLAR MEMORY CELL HAVING CAPACITORS

BACKGROUND OF THE INVENTION

1. Field of the Invention

The present invention relates to a bipolar memory cell and, more particularly, to a bipolar memory cell having capacitors and Schottky-barrier diodes (hereafter referred to as SBD).

2. Description of the Prior Art

FIG. 15 is an equivalent circuit diagram showing one memory cell, which includes a bipolar memory. The bipolar memory cell consists of a flip-flop circuit using two bipolar transistors 51, 52 in which a base b1 is connected to a collector n2 of the transistor 52 and an upper word line W1 through a parallel connecting object having a resistor r2, a SBD d2 and a capacitor c2. A base b2 of the transistor 52 is connected to a collector n1 of the transistor 51 and the word line W1 through a parallel connecting object having a resistor r1, a SBD d1 and a capacitor c1. The transistors 51, 52 have two emitters, respectively. One emitter e1d of the transistor 51 is connected to a digit line D1, the other emitter e1h thereof is connected to a lower word line W2. One emitter e2d of the transistor 52 is connected to a digit line D2, the other emitter e2h thereof is connected to the word line W2.

For example, as prior art of the bipolar memory cell, a device structure is disclosed in "SOFT-ERROR CHARACTERISTICS IN BIPOLAR MEMORY CELLS WITH SMALL CRITICAL CHARGE" by Y. Idei et al. in VLSI Symposium circuit, pp. 27-28, 1989. FIG. 14A shows a plane diagram showing a semi-device region of the bipolar memory cell and FIG. 14B is a sectional diagram along an E—E line of the divided FIG. 14A. In general, to form the memory cell the two device regions shown in FIG. 14A are connected by wirings. An N+ type buried layer 42 is formed on a P type semiconductor substrate 41, an N− type epitaxial layer 43 is formed on the buried layer 42. Further, the substrate 41 is divided into multiple device regions. The epitaxial layer 43 comprises a base region 46 having two emitter regions 47, high density N type region extending from a capacitor forming region 49 near the substrate surface to the N+ type buried layer 42, and a platinum silicide layer near a surface of an SBD forming region 48. Moreover, a dielectric film (tantalum pentoxide) may be formed on the high density N type region of the capacitor forming region 49. A barrier metal film is formed on the dielectric film, and extended to a surface of the platinum silicide of the SBD forming region 48. Therefore, a capacitor and an SBD are constructed, respectively.

There is a problem that the bipolar memory cell having the SBD is affected by the so-called soft-error, easily. That is, the flip-flop state is inverted by a current through the OFF-state SBD, for example, in response to a noise current caused by an alpha ray incidence. To solve this problem, it has been considered to increase a junction capacitance by extending the SBD forming region 48, so that the soft-error occurrence may be controlled desirably. However, this causes difficulty in realizing high integration of a semiconductor device. To solve this, the prior art described above proposes to increase the soft-error tolerance by connecting the capacitor formed by using ferroelectric material with the SBD.

Recently, considering the high integration of a semiconductor device, a new bipolar memory cell is desirable which enables further high integration of the semiconductor device. The bipolar memory cell of the prior art described above has a problem in that reduction in the SBD forming region 49 causes a decrease in the soft-error tolerance. Otherwise, a large-capacity capacitor is required to reduce the SBD forming region 49 and maintain the soft-error tolerance. However, an increase in the capacitor capacitance results in a requirement for an expansion of the capacitor forming region 49, and high integration of the semiconductor device is difficult.

Therefore, an object of the present invention is to provide a novel bipolar memory cell which is characterized by a superior soft-error tolerance, and is suitable for a highly integrated memory device.

SUMMARY OF THE INVENTION

A bipolar memory cell according to the present invention comprises a Schottky-barrier diode and a capacitor, wherein the capacitor is made of a polysilicon layer formed on an insulating layer covering a semiconductor substrate having a shape that is along three directions of the Schottky-barrier diode, a dielectric film covering the side and the top of the polysilicon layer, and a conductive film formed on the side and the top of the dielectric film.

According to the present invention, as the capacitor is formed three-dimensionally on the insulating layer on the semiconductor substrate, it is possible to increase the capacitor capacitance by increasing the height of the polysilicon layer without expanding the capacitor forming region in a plane. Therefore, a new bipolar memory cell can be obtained characterized by the capability to realize a highly integrated memory and maintaining the soft-error tolerance. Further, as the capacitor is formed on the insulating layer, the shape and the region of the capacitance forming part can be changed optionally.

BRIEF DESCRIPTION OF THE DRAWINGS

The above and other objects, advantages and features of the present invention will be more apparent from the following description by taken in conjunction with the accompanying drawings, in which.

DETAILED DESCRIPTION OF THE PREFERRED EMBODIMENTS

Figure 1:
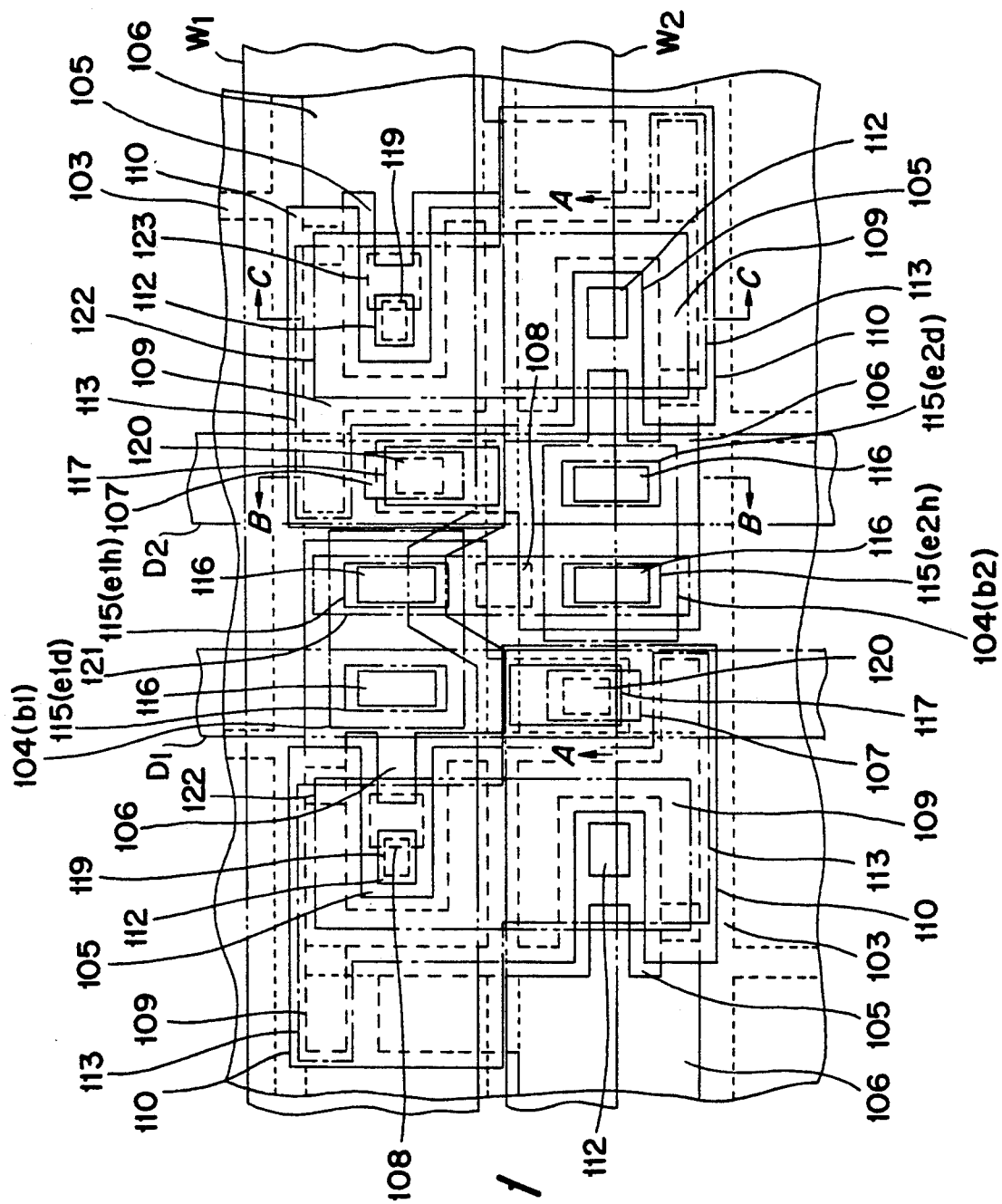
FIG. 1 is a horizontal projection view showing a first embodiment of the present invention.
Figure 2:
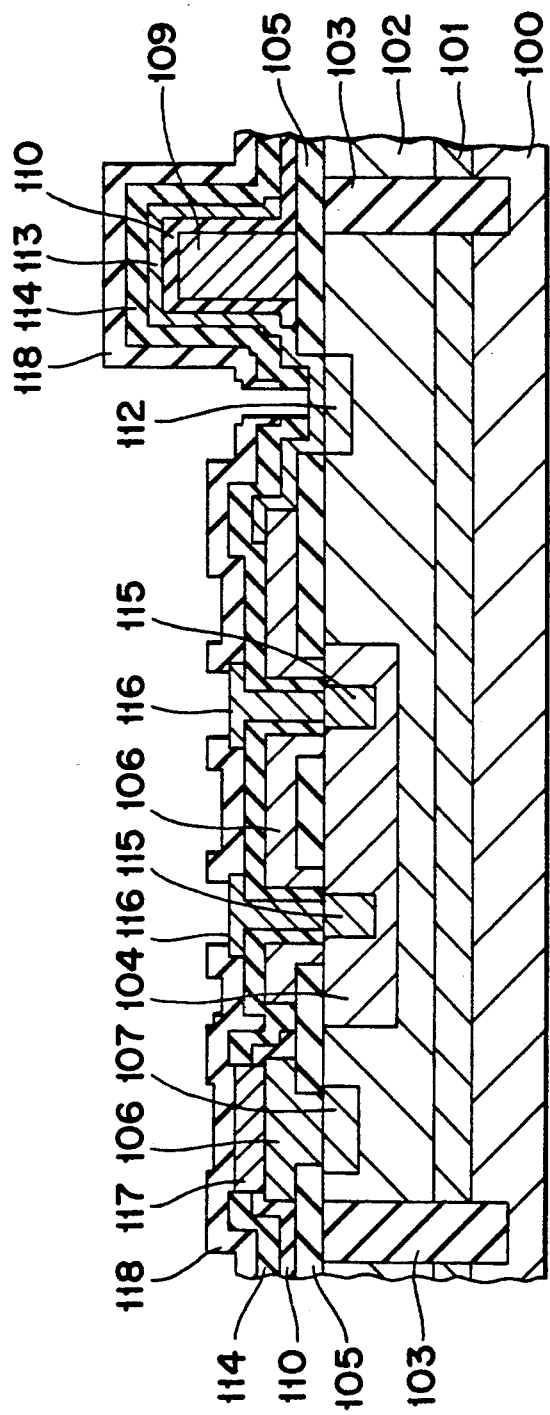
FIG. 2 is a cross sectional view along an A—A line of FIG. 1.
Figure 3:
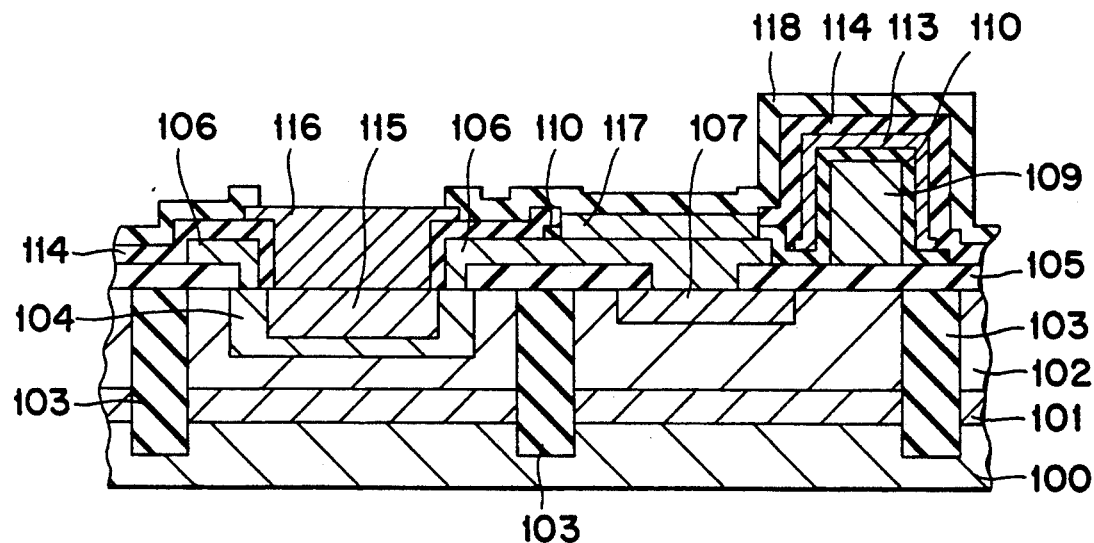
FIG. 3 is a sectional diagram along a B—B line of FIG. 1.
Figure 4:
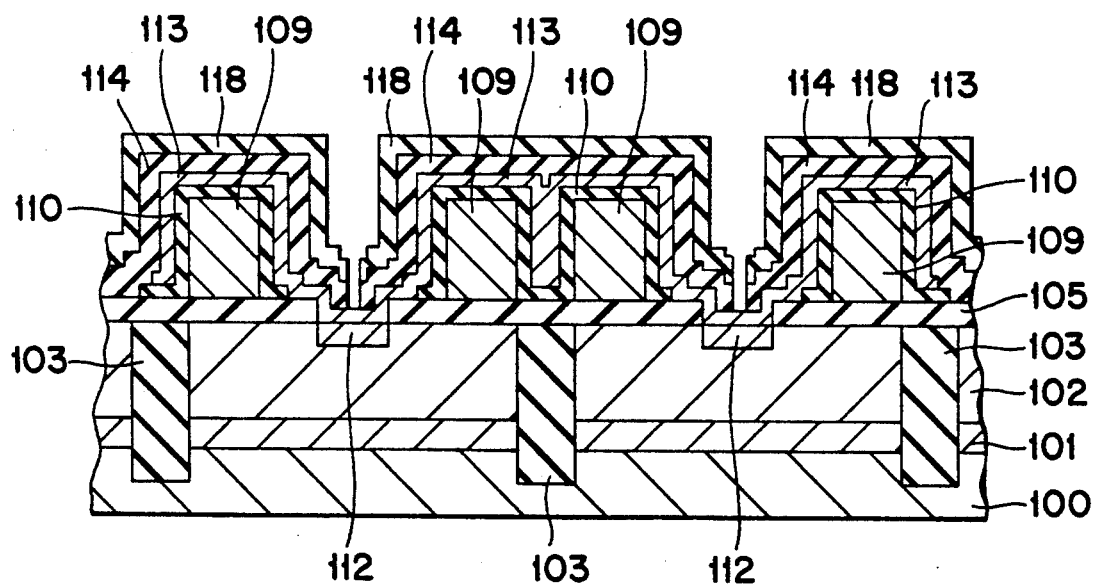
FIG. 4 is a cross sectional view along a C—C line of FIG. 1.

With reference to FIGS. 1 to 3, a first embodiment of the invention will be explained.

One bipolar memory cell according to the present invention includes one device region surrounded with an insulating and separating region 103, and another device region being close by its right-under side through the insulating and separating region 103.

Referring to FIG. 2, a N+ type buried layer 101 and a N− type epitaxial layer 102 are formed over a P is divided into multiple active device regions by the insulating and separating region 103 which is extended from a surface of the epitaxial layer 102 to the substrate 100 under the buried layer 101. Near the surface of the epitaxial layer 102, a N+ type collector contact region 107 having well-ohmic contact with a collector region, a platinum silicide layer 112 formed by platinum sintering and a base region 104 formed by a P type impurity are selectively formed at the surface of the epitaxial layer 102. The mask oxide film 105 is formed on the epitaxial layer 102. Contact holes are selectively formed at the oxide film 105 on the platinum silicide layer 112, the base region 104, the emitter region 115 and collector contact region 107.

A polysilicon layer 106 is selectively formed as a first polysilicon layer 106. The polysilicon layer 106 has a characteristic shape described below. One part of it is formed and extended over the insulating and separating region 103 and over the N+ type collector contact region 107 formed in an adjacent vertical direction device region, and the part is connected electrically to the collector contact region 107 through a contact hole 120; and another part is protruded over a region nearby the platinum silicide layer 112, the part being extended and being parallel to the protrusion.

A platinum silicide layer 117 is formed on the polysilicon layer 106 formed on the collector contact region 107, and is extended over a region nearby the insulation and separation region 103. One part of the polysilicon layer 106 is connected to the P type base region 104. As another part is connected to the N+ type collector contact region 107, it happens that the N type impurity is sucked in the layer 106, and a P-N junction is formed in it. To solve the problem, the platinum silicide 117 is provided to short the junction.

A second polysilicon layer 109 is formed on the mask oxide film 105 within the insulating and separating region 103. The polysilicon layer 109 is formed along three directions of a platinum silicide layer 112, one part of it is formed and extended over the first polysilicon layer 106 being formed on the same device region, and another part of it is formed and extended over the first polysilicon layer 106 formed over the adjacent device region. A dielectric film 110 made of ferroelectric material such as tantalum pentoxide is formed on the side and the top of second polysilicon layer 109. Further, a barrier metal film 113 is formed on the dielectric film 110 and the mask oxide film 105. It is connected to the platinum silicide layer 112 through a contact hole being formed at the mask oxide film 105. Moreover it is connected electrically to the protrusion of the first polysilicon layer 106.

A digit line D1 is connected to an emitter electrode 116 made of polysilicon, and doped an N type impurity, and is connected electrically to an emitter region 115 (e1d) under the electrode 116. A digit line D2 is connected to an emitter electrode 116 formed within another device region, and made of the polysilicon doped with the N type impurity, and connected electrically to an emitter region 115 (e2d).

A first aluminum wiring 121 connects two emitter electrodes 116, it connects electrically an emitter region 115 (e1h) formed on one device region to an emitter region 115 (e2h) formed on adjacent device region. A second aluminum wiring 122 connects to barrier metal film 113 on a layer 112 and another layer 112 in an adjacent device region. These digit lines D1, D2 and the first and second aluminum wirings 121, 122 are formed at the same time using the patterning techniques for an aluminum film. On these wirings, an inter layer isolation layer not shown is formed.

A word line W1 is connected to the barrier metal film 113 through the contact hole which is provided at the inter layer insulating layer on the second aluminum wiring 122 near the platinum silicide layer 112 being formed in one device region.

A word line W2 is connected to the first aluminum wiring 121 through a contact hole being formed at the inter-layer insulation layer, the emitter electrodes 116 and the emitter regions 115 (e1h and e2h). These word lines W1 and W2 are formed at the same time using the patterning techniques for an aluminum film in the lateral direction of device region.

Referring to FIG. 5 to FIG. 8, a fabrication method of the first embodiment of the present invention is explained below.

Figure 5:
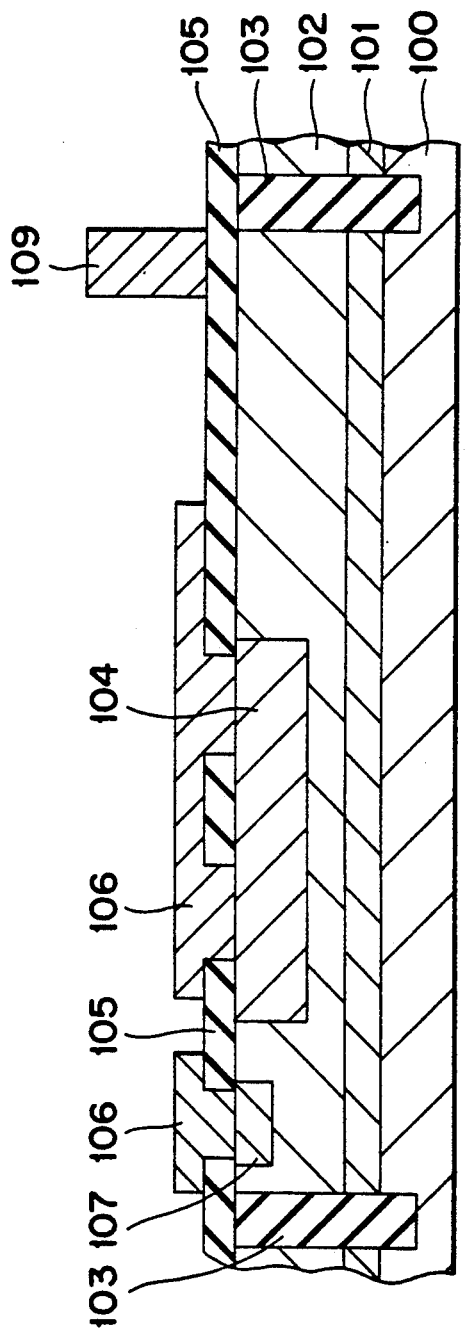
FIGS. 5 to 8 are cross sectional views showing the major manufacturing steps of the memory of FIG. 1 along the A—A line of the FIG. 1.
Figure 6:
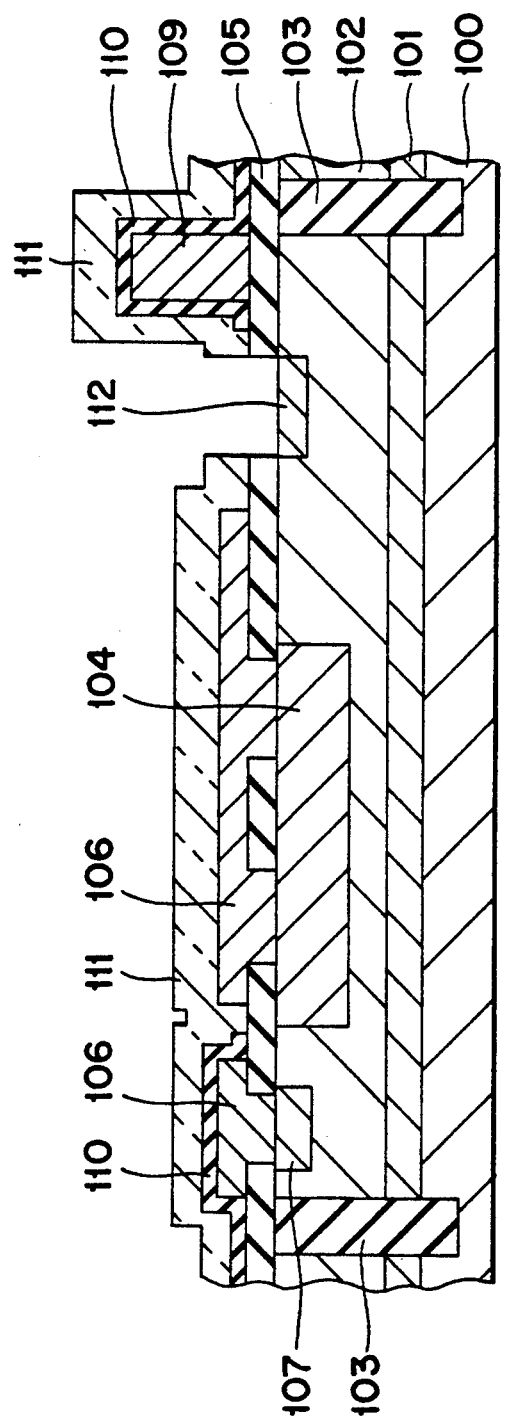
Figure 7:
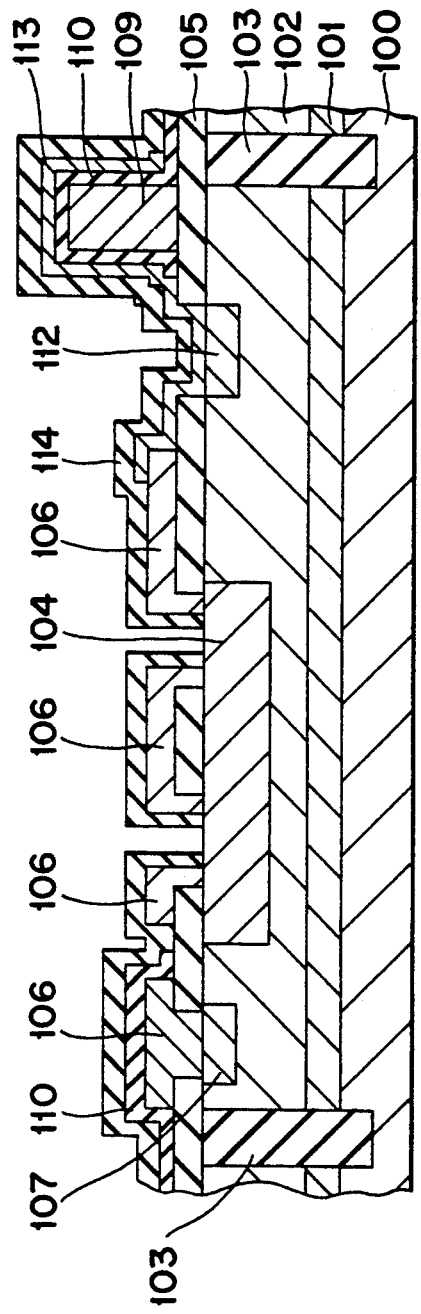
Figure 8:
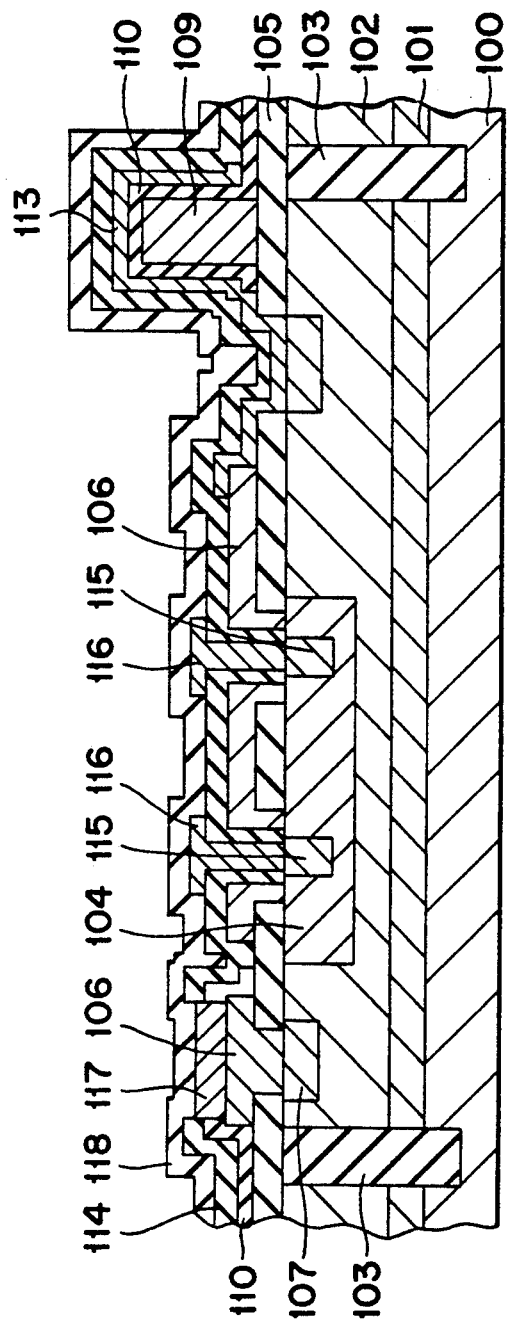

First, as shown in FIG. 5, the N+ type buried layer 101 is formed on the P type semiconductor substrate 100, and the N− type epitaxial layer 102 is grown up on the buried layer 101. After that, the insulating and separating region 103 is formed selectively. The substrate 100 is partitioned into multiple device regions. Further, the base region 104 is formed on the surface of the epitaxial layer 102 by leading the P type impurity to enter it. The mask oxide layer 105 is grown up on the entire main surface of the epitaxial layer 102. Providing the contact hole for collector contact, the N+ type collector contact region 107 is formed in the N− type epitaxial layer 102. Moreover, after opening a contact hole at the mask oxide layer 105 on the base region 104 selectively, the polysilicon layer is formed on the entire main surface to fill the contact hole for the base and the collector up, for example, with a thickness of about 2300 angstrom units. Further, after leading a P type impurity, for example, boron, the first polysilicon layer 106 can be obtained by patterning it. Next, after covering the predetermined region of the first polysilicon layer 106 with a nitride film not shown, a polysilicon layer is formed on the entire main surface with a thickness of about 1.5 micron, for example. Moreover, patterning this polysilicon layer, the second polysilicon layer 109 can be obtained. After this, the nitride film is removed. By this process, the first and the second polysilicon layers 106 and 109 are connected electrically to each other at the region not covered with the nitride film. Then, tantalum pentoxide, for example, is formed on the entire main surface, by patterning the dielectric film 110 formed on the side and the top of the second polysilicon layer 109 can be obtained. After this, nitride film 111 is grown up on the entire main surface, the contact hole is provided, which is extended from the surface of the nitride film 111 to the surface of the epitaxial layer 102. Further, after sputtering the surface of the epitaxial layer 102 at the contact hole with platinum, and annealing, a platinum silicide layer 112 is formed. Subsequently, as shown in FIG. 7, after removing the nitride film 111, a metal or a metal compound becoming the barrier metal film 113 is deposited, and by patterning this metal such as in a predetermined shape, the barrier metal film 113 is formed. Further, providing a contact hole at the first polysilicon layer filling up the two contact holes being formed at the mask oxide layer 105, respectively, one part of the base region 104 is exposed. Further, the two contact holes are filled up with an insulating film 114 by forming it at the entire main surface. Moreover, providing two contact holes for the filled insulating film 114, one part of the base region 104 is exposed, again. Thereafter, as shown in FIG. 8, the N+ type emitter regions 115 and N+ type emitter electrodes 116 made of polysilicon are formed. Further, the polysilicon layer 106 is exposed by removing the insulator on it. Sputtering the exposed polysilicon layer with platinum, and annealing this, platinum silicide layer 117 is formed at the surface of the exposed polysilicon layer. Furthermore, after an inter layer insulating layer 118 is formed on the entire main surface, a structure as shown in FIG. 2 can be obtained by forming contact holes on two emitter electrodes 116 and the platinum silicide layer 112, respectively.

In the bipolar memory cell according to this embodiment, within one device region surrounded with the insulating and separating region, the transistor 51, the capacitor C1, resistor r1 and the SBD d2 are formed, within the other device region close by the region at the right-under side, the transistor 52, the capacitor C2, the resistor r2 and the SBD d1 are formed. The resistors r1 and r2 are formed at the protrusion of the second polysilicon layer 109 being connected to the barrier metal film 113.

According to this embodiment, the capacitance of the capacitor is formed not only by the top of the second polysilicon layer 109, but also the side of it. That results in a large capacitor capacitance with a small plane projection area. Therefore, this can improve soft-error tolerance. Further, as the second polysilicon layer 109 has a characteristic shape, such as one part of it is extended toward the lateral direction of the device region over the adjacent device region, the capacitance can be enlarged. Furthermore, since the extended part of the layer 106 forms a condenser with the collector region 102 in the adjacent device region, the capacitance can be much enlarged, and the soft-error tolerance improved. Furthermore, the second polysilicon layer 109 is formed along the three directions of the platinum silicide layer 112, and the protrusion of the first polysilicon layer 106 is formed and extended to the region nearby the platinum silicide layer 112 and, between the two parts of second polysilicon layer 109. Therefore, covering the second polysilicon layer 109 with the barrier metal layer 113 to form the capacitor, results in the platinum silicide layer 112 and the protrusion of the first polysilicon layer 106 being covered with the barrier metal film 113 promoting ease of connection to each other, even if the accuracy of mask alignment is not high. Moreover, the platinum silicide layer 117 is formed on the first polysilicon layer 106 over the collector contact region 107 along and toward the layer 106 extended to adjacent the device region. Therefore, the P-N junction in the layer 106 can be made, caused by the N type impurity.

Figure 9:
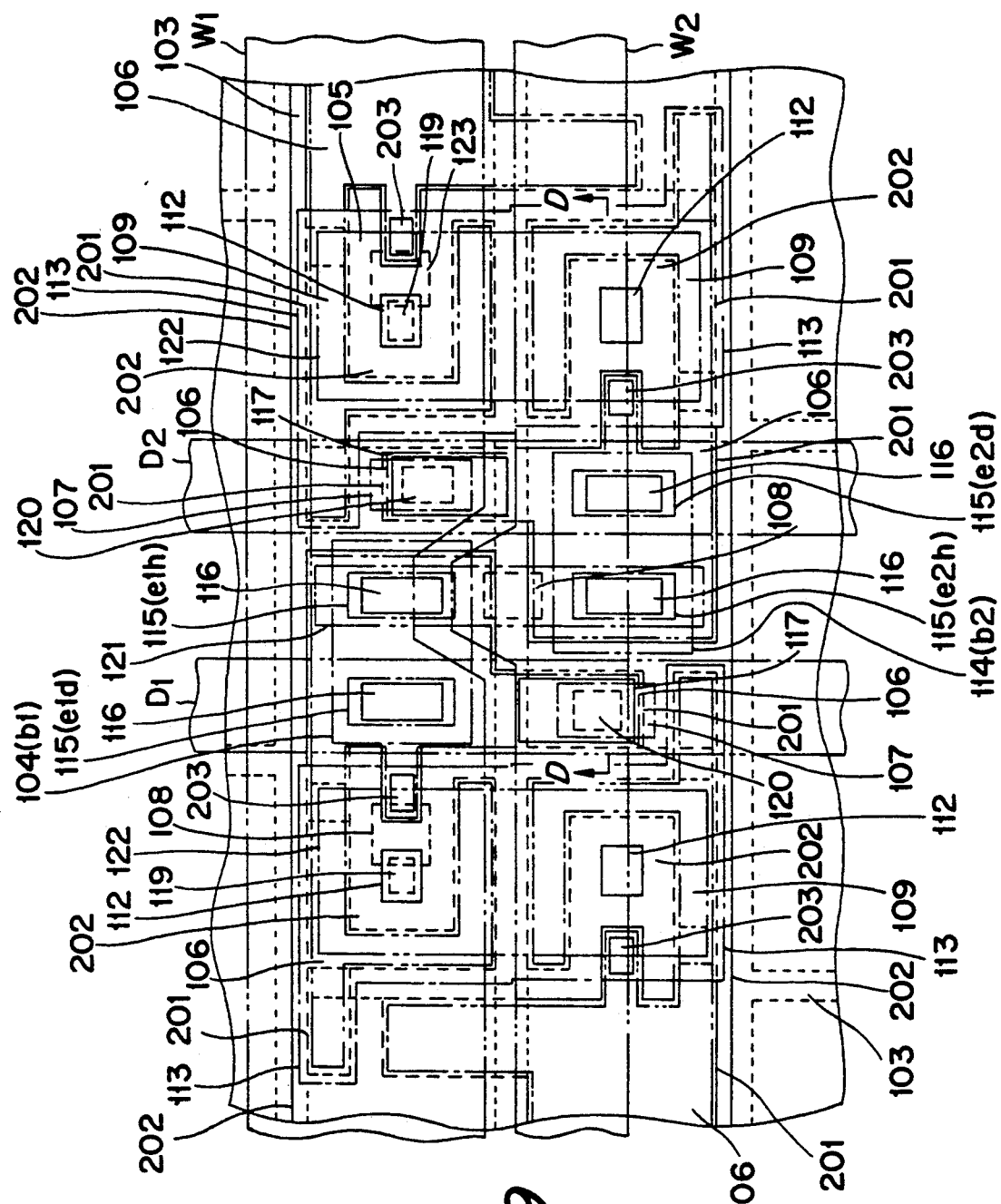
FIG. 9 is a horizontal projection view showing a second embodiment of the present invention.

Next, the second embodiment of the present invention is explained below, referring to FIG. 9 and FIG. 10. This embodiment is different from the first embodiment in having a dielectric film of a capacitor, which consists of an oxide film 201 and a nitride film 202, and in having a contact hole which is used for connecting electrically the first polysilicon layer 106 to the barrier metal film 113. The other structure is basically the same as the first embodiment. A detailed explanation is abbreviated by showing the same reference number to the components which are similar to those components as shown in FIG. 1 and FIG. 2.

In this embodiment, the oxide film 201 is formed around the first and second polysilicon layers 106, 109. The film 201 is formed by thinly oxidizing the surface of the first and second polysilicon layers 106, 109. The capacitance nitride film 202 is formed on the mask oxide film 105 on which neither of the first and second polysilicon layers 106, 109 are formed, and surrounds the oxide film 201.

Next, the fabrication process of the second embodiment is explained, referring to FIG. 9 through FIG. 12. First, after forming a buried layer 101 and an epitaxial layer 102 on a semiconductor substrate 100 in sequence, a contact hole is opened and a N+ type collector contact region 107 is formed. Two contact holes are formed by removing the mask oxide layer 105 on a base region 104 selectively. After this, the first polysilicon layer 106 is formed on the mask oxide layer 105 selectively and fills up the contact holes for the base and the collector regions. Further, the second polysilicon layer 109 is formed on the mask oxide layer 105 selectively, nearby an insulating and separating region 103 surrounds a device region. The layers 106 and 109 are connected at one part to each other as is the case of the first embodiment. After annealing, the oxide film 201 is formed on the layers 106 and 109 oxidizing the surface of the layers in a thickness of about 50 angstroms.

Subsequently, the capacitance nitride film 202 is grown up on the entire main surface in a thickness of about 100 angstroms. After this, a contact hole is selectively formed which is extended from the surface of the capacitor nitride film 202 to the surface of the epitaxial layer 102, and a platinum silicide layer 112 is formed in the contact hole at the surface of the epitaxial layer 102.

Figure 10:
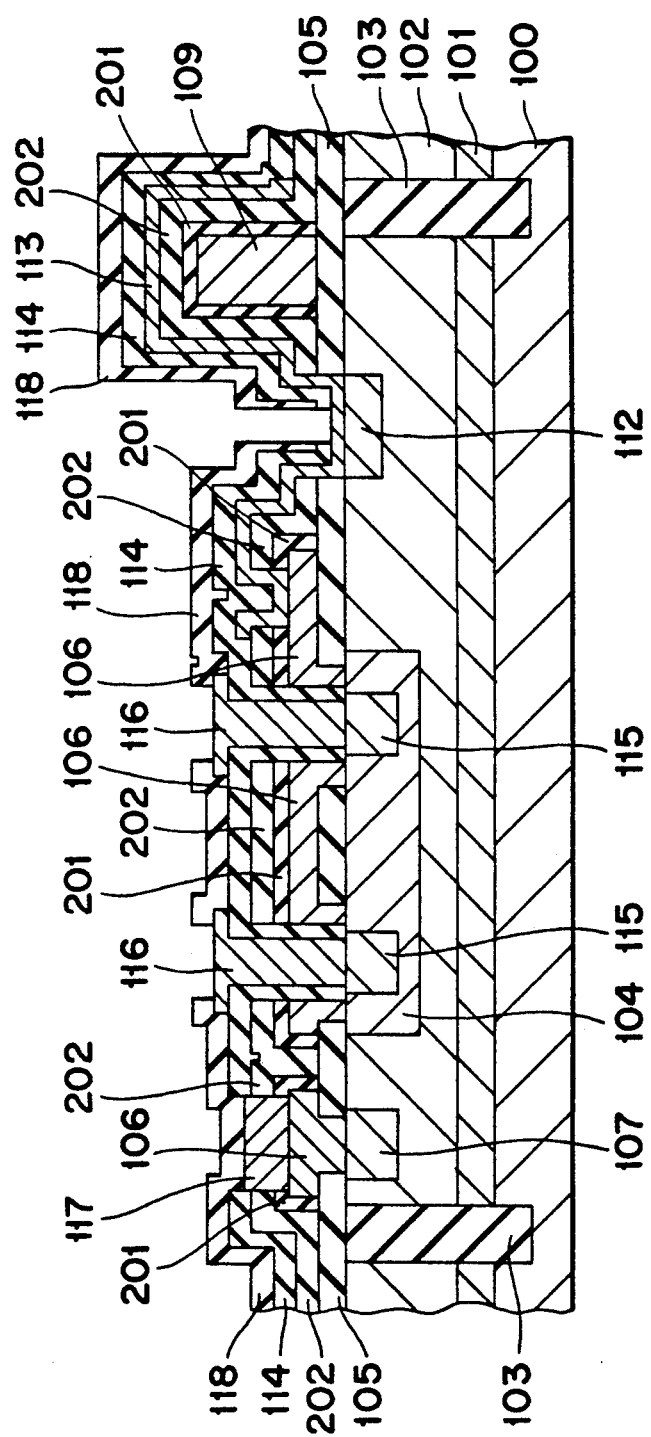
FIG. 10 is the cross sectional view along the D—D line of the FIG. 9.
Figure 11:
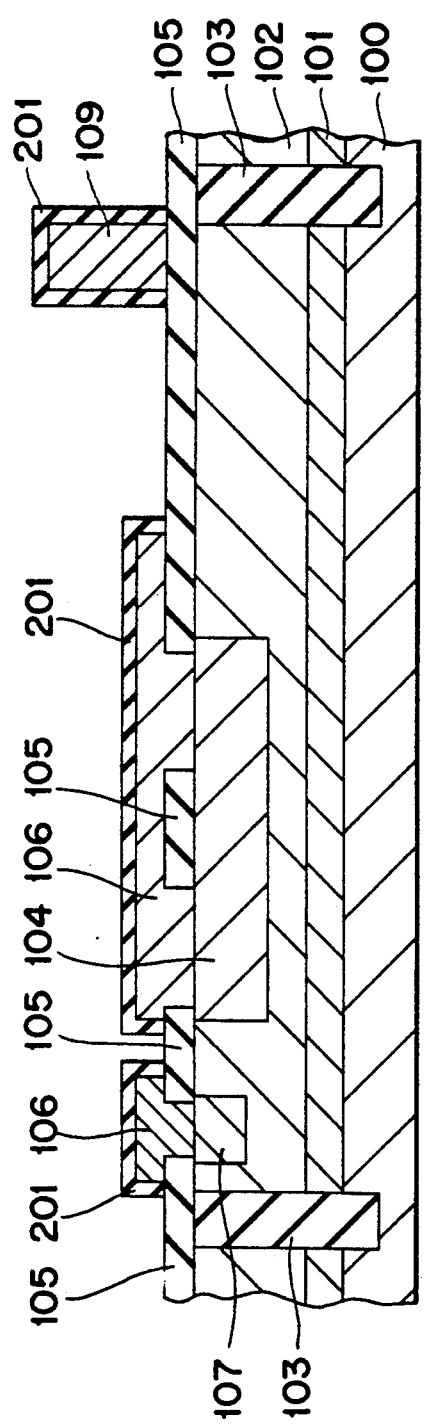
FIGS. 11 and 12 are cross sectional views showing the major steps in a fabrication process along the D—D line of the FIG. 9.
Figure 12:
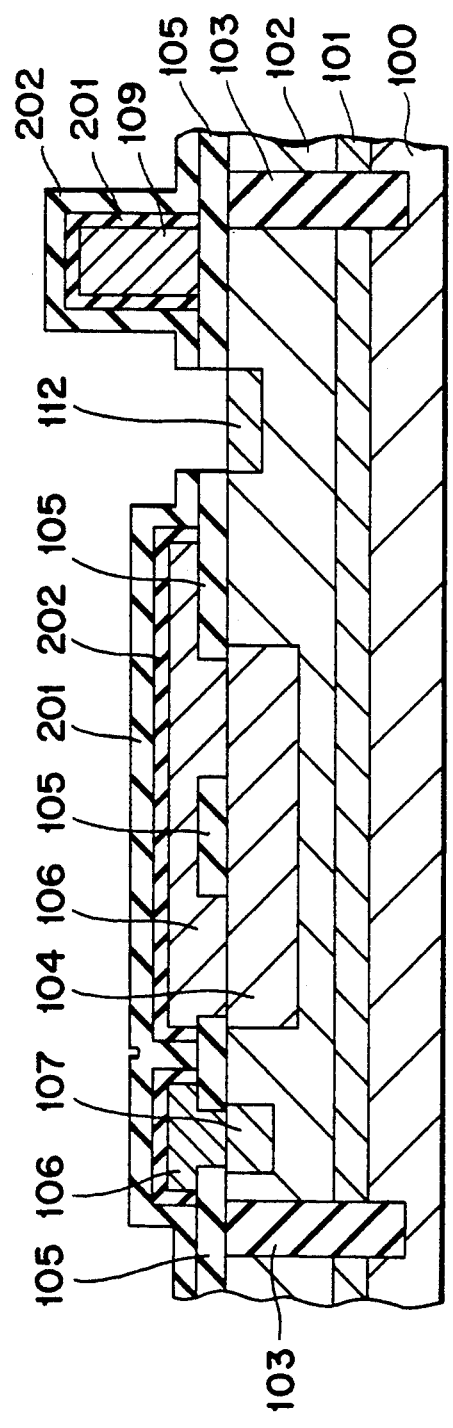

Then, as shown in FIG. 10, after removing selectively the oxide film 201 and the capacitance nitride film 202, a barrier metal film 113 is deposited and patterned into a predetermined pattern, which is connected to both a protrusion of the first polysilicon layer 106 and the platinum silicide layer 112, covering the side and the top of the capacitance nitride film 202.

According to this embodiment, there are advantages as described below adding to those explained in the first embodiment. That is, in this embodiment, the dielectric film of the capacitor consists of two layers having the oxide film 201 and the capacitance nitride film 202. Therefore, the oxide film 201 can be formed self-alignment at the surface of the first and second polysilicon layers 106, 109. Besides, the capacitance nitride film can be used for a mask to form the platinum silicide layer 112. Thus, the memory cell according to this embodiment, has an advantage over the first embodiment in producing facility.

Figure 13:
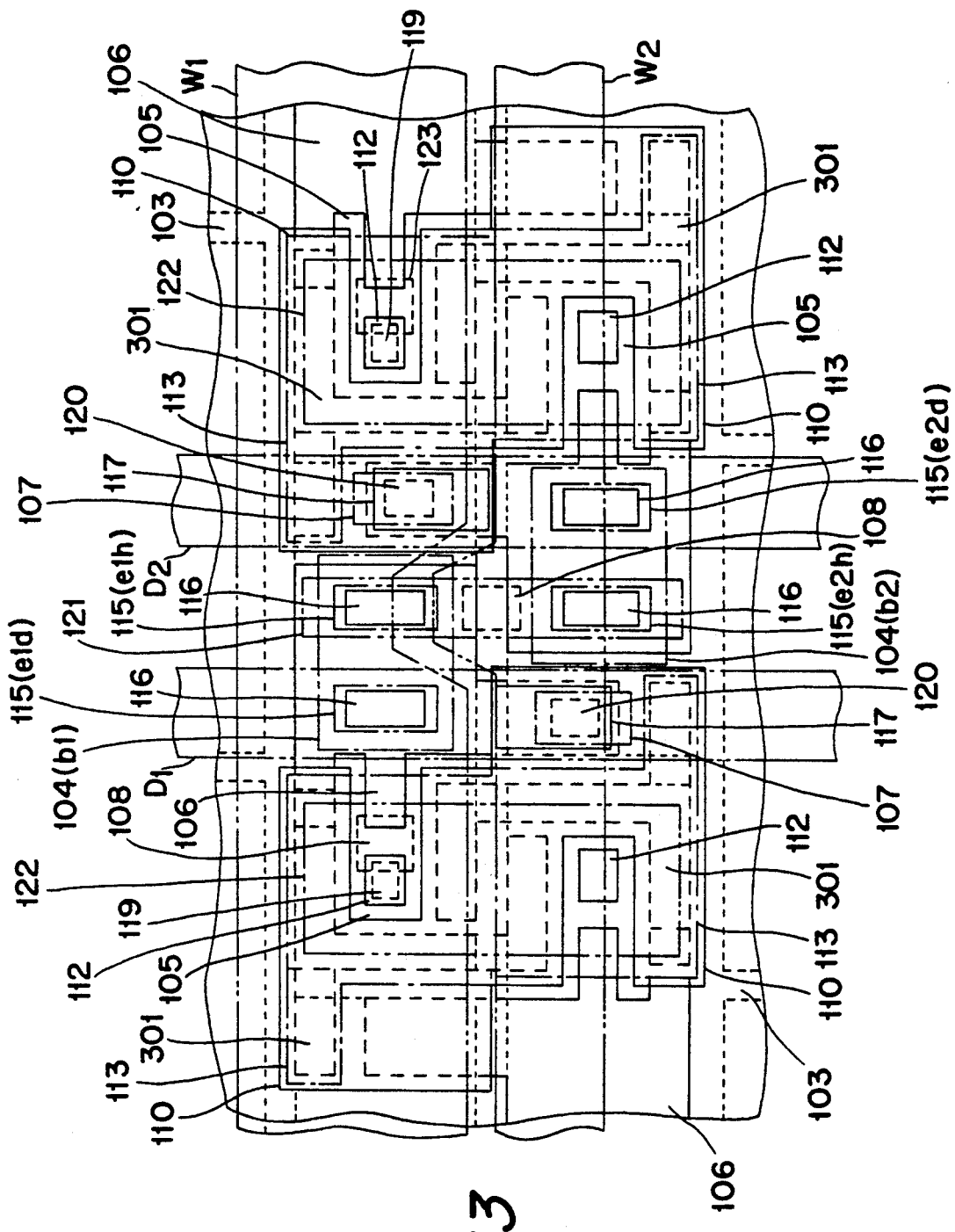
FIG. 13 is a horizontal projectional view showing a third embodiment of the present invention.
Figure 14A:
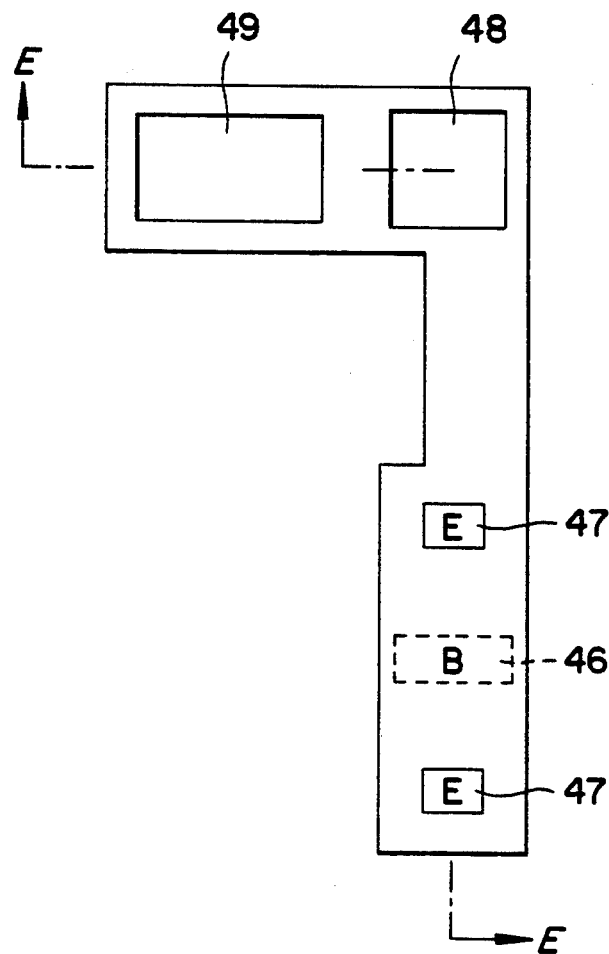
FIGS. 14A is a horizontal projection view showing the prior art.
Figure 14B:
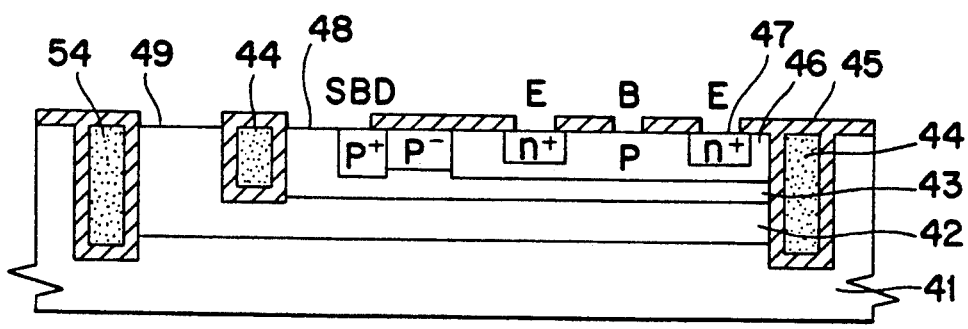
FIGs. 14B is a cross sectional view taken along the E—E line, respectively.
Figure 15:
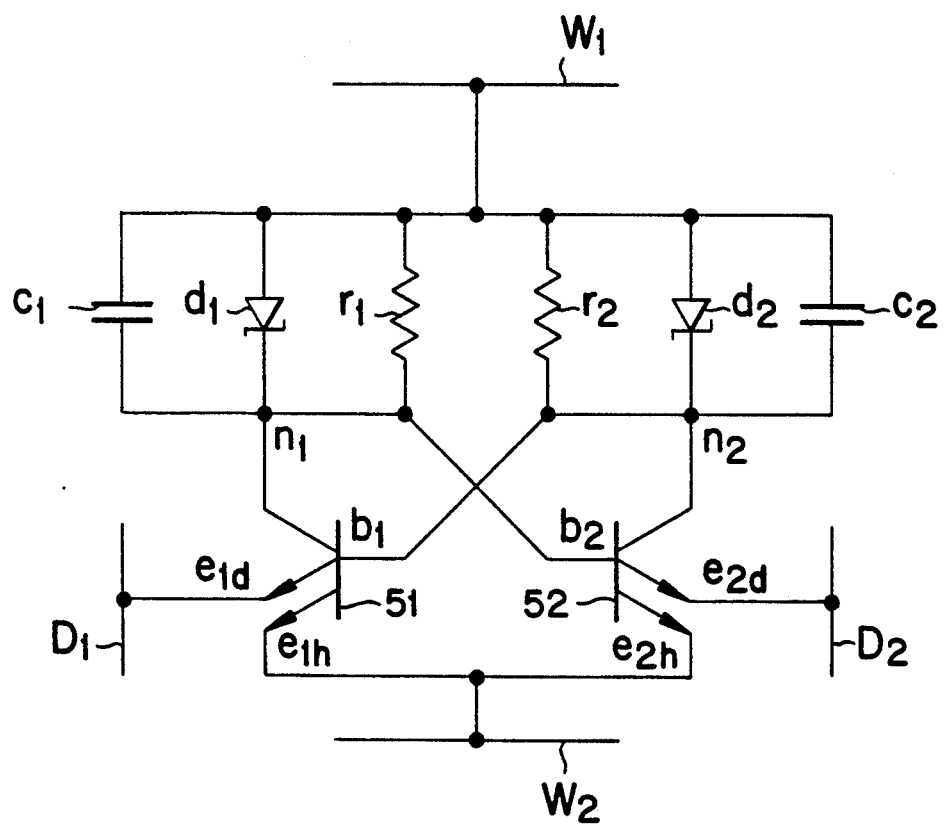
FIG. 15 is an equivalent circuit diagram of the bipolar memory cell having capacitor and Schottky-barrier diodes.

Next, a third embodiment of the present invention is explained referring to FIG. 13.

A detailed description is abbreviated by using the same reference number for those components which are similar to the components shown in FIG. 1.

In this embodiment, a second polysilicon layer 301 is formed and extended toward the vertical direction of the device region over the insulating and separating region 103 and over the adjacent device region. Furthermore, it is formed as if one layer 301 meshes with next layer 301 without touching each other.

In this embodiment, the same advantages result as described with respect to the first embodiment.

Although the invention has been described with reference to specific embodiments, this description is not meant to be constructed in a limiting sense. Various modifications of the disclosed embodiments will become apparent to persons skilled in the art upon reference to the description of the invention. It is therefore contemplated that the appended claims will cover any modifications or embodiments as may fall within the scope of the invention. For example, the first polysilicon layer 106 can be formed and extended over the insulating and separating region 103 without touching another first and second polysilicon layer being formed on another device region. Although capacitance may become small, the second polysilicon layers 109 and 301 having no protrusion may extend over the insulating and separating region 103 and over an adjacent device region. Moreover, the second polysilicon layers 109, 301 may be formed along the two directions of the platinum silicide layer 112. As common masks can be used for forming the dielectric film 110 and the barrier metal film 113, even if the mask for the second polysilicon layer 109 is changed the capacitance of the condenser can be changed easily.

What is claimed is:

1. A semiconductor device comprising: a semiconductor substrate, first and second bipolar transistors formed at a major surface of said semiconductor substrate, a Schottky-barrier diode formed on a predetermined area of each of said first and second bipolar transistors, a capacitor formed on each of said first and second bipolar transistors, each said capacitor including an insulating layer covering a surface of a respective one of said first and second bipolar transistors, a polysilicon layer formed on said insulating layer in a pattern that extends around said predetermined area, a dielectric film formed covering said polysilicon layer, and a conductive film covering said dielectric film, wherein each said polysilicon layer respectively extends and connects to a base region of one of said first and second bipolar transistors.

wherein one part of each said polysilicon layer serves as a resistor, and each said conductive film respectively extends and connects to a said resistor, wherein each said conductive film respectively extends and connects to an anode of a said Schottky-barrier diode, and wherein each said anode of each said Schottky-barrier diode is formed to have a substantially square shape in a respective said predetermined area, and each said polysilicon layer is respectively formed on a said insulating layer in a pattern that extends around at least two sides of said substantially square shape.

2. A semiconductor device including a plurality of active device regions comprising:

a P type semiconductor substrate;

an N type buried layer formed on said P type semiconductor substrate;

an N type epitaxial layer formed over said N type buried layer;

an insulating and separating region extended from a surface of said epitaxial layer to said semiconductor substrate under said N type buried layer, said insulating and separating region dividing said semiconductor substrate into said plurality of active device regions;

an N type collector contact region, said N type collector contact region having well-ohmic contact with a collector region and formed near the surface of said N type epitaxial layer;

a first platinum silicide layer selectively formed at the surface of said N type epitaxial layer;

a P type impurity base region, said P type impurity base region being selectively formed at the surface of said N type epitaxial layer;

a mask oxide film formed on said N type epitaxial layer;

a first polysilicon layer, a part of said first polysilicon layer being formed and extended over the insulating and separating region and over the N type collector contact region and being electrically connected to the collector contact region, and a part of said first polysilicon layer being connected to said P type base region;

a second platinum silicide layer, said second platinum silicide layer being formed on said first polysilicon layer formed on said N type collector contact region;

a second polysilicon layer, said second polysilicon layer being formed on said mask oxide film within said insulating and separating region, said second polysilicon layer being formed along three directions of said first platinum silicide layer with one part of said second polysilicon layer being formed and extended over said first polysilicon layer formed on one of said plurality of active device regions and another part of said second polysilicon layer being formed and extended over said first polysilicon layer formed over an adjacent one of said plurality of active device regions;

a dielectric film formed on a side surface and a top surface of said second polysilicon layer;

a barrier metal film formed on said dielectric film and said mask oxide film, said barrier metal film being connected to said first platinum silicide layer and being electrically connected to said first polysilicon layer; and an emitter region formed within said P type impurity base region.

3. The semiconductor device as set forth in claim 2, further comprising:

an oxide film formed on a surface of a first polysilicon layer and the second polysilicon layer; and a nitride film formed on the mask oxide film on which neither of the first polysilicon layer nor the second polysilicon layer is formed, said nitride film surrounding said oxide film.

4. The semiconductor device as set forth in claim 2, wherein said second polysilicon layer is formed and extended toward a vertical direction of one of said plurality of active device regions over the insulating and separating region and over an adjacent one of said plurality of active device regions.

* * * * *